(12) United States Patent
Asami

(10) Patent No.: US 7,960,995 B2
(45) Date of Patent: Jun. 14, 2011

(54) TESTING APPARATUS AND TESTING METHOD

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 478 days.

(21) Appl. No.: 12/210,223

(22) Filed: Sep. 15, 2008

(65) Prior Publication Data

US 2009/0043528 A1 Feb. 12, 2009

Related U.S. Application Data

(63) Continuation of application No. PCT/JP2007/058436, filed on Apr. 18, 2007.

(30) Foreign Application Priority Data

Apr. 27, 2006 (JP) ................................. 2006-123317

(51) Int. Cl.
G01R 31/26 (2006.01)
(52) U.S. Cl. .................................................. 324/762.01
(58) Field of Classification Search .................. None
See application file for complete search history.

(56) References Cited

U.S. PATENT DOCUMENTS

| | | | |
|---|---|---|---|
| 5,835,213 A * | 11/1998 | Curbelo | 356/451 |
| 6,023,203 A | 2/2000 | Parish | |
| 6,993,069 B1 | 1/2006 | Donati et al. | |
| 7,433,660 B2 * | 10/2008 | Rooyen et al. | 455/133 |
| 2004/0208251 A1 | 10/2004 | Learned et al. | |
| 2005/0239506 A1 | 10/2005 | Li | |
| 2005/0240852 A1 | 10/2005 | Inaba et al. | |
| 2006/0050805 A1 | 3/2006 | Chen et al. | |
| 2008/0084951 A1 * | 4/2008 | Chen et al. | 375/347 |
| 2011/0054827 A1 * | 3/2011 | Ishida et al. | 702/125 |

FOREIGN PATENT DOCUMENTS

| | | |
|---|---|---|
| EP | 1643636 | 4/2006 |
| JP | 08-184645 | 7/1996 |
| JP | 10-096750 | 4/1998 |
| JP | 10-164149 | 6/1998 |
| JP | 11-044723 | 2/1999 |
| JP | 2001-251219 | 9/2001 |
| JP | 2002-300224 | 10/2002 |
| JP | 2006-317369 | 11/2006 |

OTHER PUBLICATIONS

"Office Action of Germany Counterpart Application", issued on Aug. 27, 2010, p. 1-p. 7, in which the listed references were cited.
Particial translation of above-listed Office Action of Germany Counterpart Application of Aug. 27, 2010, p. 1-p. 11.

* cited by examiner

*Primary Examiner* — Vinh P Nguyen
(74) *Attorney, Agent, or Firm* — Jianq Chyun IP Office

(57) ABSTRACT

Provided is a test apparatus that tests a device under test that outputs a plurality of modulated signals modulated with carrier signals having frequencies identical to each other, including a synthesizing section that synthesizes the plurality of modulated signals to output a synthesized signal; an AD converting section that samples the synthesized signal to output a digital signal corresponding to the synthesized signal; and a judging section that judges acceptability of the plurality of modulated signals output by the device under test, based on the digital signal.

13 Claims, 8 Drawing Sheets

US 7,960,995 B2

TESTING APPARATUS AND TESTING METHOD

CROSS REFERENCE TO RELATED APPLICATION

This is a continuation application of PCT/JP2007/058436 filed on Apr. 18, 2007 which claims priority from a Japanese Patent Application No. 2006-123317 filed on Apr. 27, 2006, the contents of which are incorporated herein by reference.

BACKGROUND

1. Technical Field

The present invention relates to a test apparatus and a test method. In particular, the present invention relates to a test apparatus and a test method for testing a device under test that outputs a plurality of modulated signals obtained by modulating carrier signals having identical frequencies, or a device under test that outputs a plurality of baseband signals.

2. Related Art

MIMO (Multiple Input Multiple Output) is known as a type of wireless spatial multiplexing transmission. Transmission devices using MIMO simultaneously perform wireless transmission of a plurality of modulated signals having identical carrier frequencies. MIMO is scheduled to be adopted by IEEE 802.11n, for example.

Since no prior art is known at this time, no prior art documents are included.

A test apparatus that tests a transmission device that uses MIMO causes the transmission device to simultaneously output a plurality of modulated signals, simultaneously AD converts and demodulates these modulated signals, and judges acceptability of the resulting signals. Accordingly, the test apparatus must be provided with a plurality of demodulators and a plurality of AD converters to correspond to the plurality of modulated signals. The inclusion of these components results in the conventional test apparatus being large and expensive.

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

SUMMARY

According to a first aspect related to the innovations herein, one exemplary test apparatus may include a test apparatus that tests a device under test that outputs a plurality of modulated signals modulated with carrier signals having frequencies identical to each other, including a synthesizing section that synthesizes the plurality of modulated signals to output a synthesized signal; an AD converting section that samples the synthesized signal to output a digital signal corresponding to the synthesized signal; and a judging section that judges acceptability of the plurality of modulated signals output by the device under test, based on the digital signal.

The AD converting section may include a demodulator that quadrature demodulates the synthesized signal output by the synthesizing section to output a demodulated signal; a first AD converter that samples an in-phase component of the demodulated signal to output a first digital signal corresponding to the in-phase component; and a second AD converter that samples a quadrature component of the demodulated signal to output a second digital signal corresponding to the quadrature component, and the judging section may judge the acceptability of the plurality of modulated signals output by the device under test based on the first digital signal and the second digital signal.

The AD converting section may include a frequency converting section that multiplies the synthesized signal output from the synthesizing section by a local signal having a prescribed frequency to output an intermediate signal having a frequency lower than that of the synthesized signal; an AD converter that samples the intermediate signal to output a digital signal corresponding to the intermediate signal; and a demodulator that quadrature demodulates the digital signal to output a demodulated signal, and the judging section may judge the acceptability of the plurality of modulated signals output by the device under test based on a first digital signal indicating the in-phase component of the demodulated signal and a second digital signal indicating the quadrature component of the demodulated signal.

The AD converting section may further include a decimation filter that decreases a sampling frequency of the first digital signal and the second digital signal by thinning the data values in the first digital signal and the second digital signal output by the demodulator.

The device under test may quadrature modulate each of a plurality of baseband signals to generate the plurality of modulated signals, and the judging section may judge the acceptability of the plurality of modulated signals based on whether a phase and an amplitude of each demodulated signal is within a range of expected values of the phase and amplitude designated according to a combination of the plurality of baseband signals.

The device under test may be able to switch between operating in a first mode and a second mode, where the first mode involves generating the plurality of modulated signals by quadrature modulating each of the plurality of baseband signals with substantially the same gain and the second mode involves generating the plurality of modulated signals by quadrature modulating each of the plurality of baseband signals with a different gain. The test apparatus may further include a test control section that performs a first test causing the judging section to judge the acceptability of the plurality of modulated signals while the device under test operates in the first mode, and performs a second test causing the judging section to judge the acceptability of the plurality of modulated signals while the device under test operates in the first mode, the second test being performed on a condition that the plurality of modulated signals are judged to be acceptable during the first test, and the test control section may judge the device under test to be non-defective if the plurality of modulated signals are judged to be acceptable in both the first test and the second test.

The test apparatus may further include a plurality of switches that are provided to correspond one-to-one with the plurality of modulated signals, and that each switch whether the corresponding modulated signal is supplied to the synthesizing section; and a test control section that performs a first test in which the judging section judges the acceptability of the plurality of modulated signals while the plurality of switches are turned on, and performs a second test in which the judging section judges the acceptability of at least one of the plurality of modulated signals while at least one switch corresponding to the at least one modulated signal is turned on and the other switches are turned off, the second test being performed on a condition that the plurality of modulated signals are judged to be acceptable during the first test.

According to a second aspect related to the innovations herein, one exemplary test method may include a test method for testing a device under test that outputs a plurality of modulated signals modulated with carrier signals having frequencies identical to each other, including the steps of synthesizing the plurality of modulated signals to output a synthesized signal; sampling the synthesized signal to output a digital signal corresponding to the synthesized signal; and judging acceptability of the plurality of modulated signals output by the device under test, based on the digital signal.

According to a third aspect related to the innovations herein, one exemplary test apparatus may include a test apparatus that tests a device under test that outputs a plurality of baseband signals, including a synthesizing section that synthesizes the plurality of baseband signals to output a synthesized signal; an AD converting section that samples the synthesized signal to output a digital signal corresponding to the synthesized signal; and a judging section that judges acceptability of the plurality of baseband signals output by the device under test, based on the digital signal.

According to a fourth aspect related to the innovations herein, one exemplary test method may include a test method for testing a device under test that outputs a plurality of baseband signals, including the steps of synthesizing the plurality of baseband signals to output a synthesized signal; performing an AD conversion by sampling the synthesized signal to output a digital signal corresponding to the synthesized signal; and judging acceptability of the plurality of baseband signals output by the device under test, based on the digital signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

Figure 1:
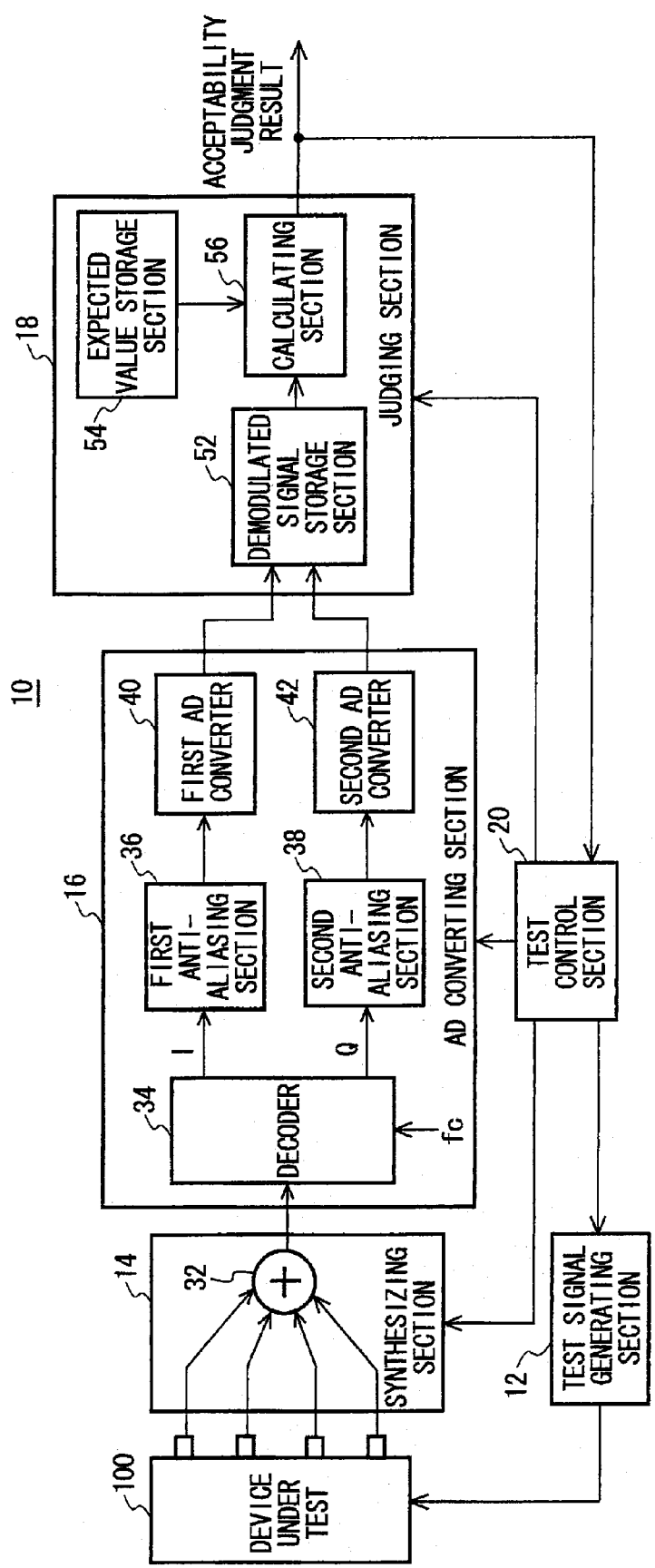
FIG. 1 shows a configuration of the test apparatus 10 according to an embodiment of the present invention, along with a device under test 100.

FIG. 1 shows a configuration of the test apparatus 10 according to an embodiment of the present invention, along with a device under test 100. The test apparatus 10 tests the device under test 100. The device under test 100 outputs a plurality of modulated signals obtained by modulating carrier signals having identical frequencies. The device under test 100 of the present embodiment generates the plurality of modulated signals by quadrature modulating a plurality of pieces of output data with carrier signals having identical frequencies. The device under test 100 outputs these modulated signals to a receiving device. For example, the device under test 100 may output each of the plurality of modulated signals corresponding to the MIMO system adopted in IEEE802.1 in from different antennas.

The test apparatus 10 is provided with a test signal generating section 12, a synthesizing section 14, an AD converting section 16, a judging section 18, and a test control section 20. The test signal generating section 12 supplies the device under test 100 with a test signal that causes the device under test 100 to simultaneously output a plurality of modulated signals. The synthesizing section 14 receives the plurality of modulated signals output by the device under test 100 in response to the test signal. The synthesizing section 14 synthesizes the plurality of modulated signals into a single signal, and outputs this synthesized signal. The synthesizing section 14 of the present embodiment may include an adding section 32 that adds together a plurality of modulated signals. The adding section 32 generates the synthesized signal by adding together the plurality of modulated signals.

The AD converting section 16 samples the synthesized signal to output a digital signal corresponding to the synthesized signal. The AD converting section 16 of the present embodiment quadrature demodulates the synthesized signal to output digital signals of the quadrature component and the in-phase component of the demodulated signal. The AD converting section 16 may include a demodulator 34, a first anti-aliasing filter 36, a second anti-aliasing filter 38, a first AD converter 40, and a second AD converter 42.

The demodulator 34 quadrature demodulates the synthesized signal output by the synthesizing section 14 to output a demodulated signal. More specifically, the demodulator 34 quadrature demodulates the synthesized signal with a carrier signal fc to output the quadrature component (Q component) and the in-phase component (I component) of the demodulated signal. The first anti-aliasing filter 36 filters the in-phase component of the demodulated signal output from the demodulator 34 to eliminate aliases in the in-phase component. The second anti-aliasing filter 38 filters the quadrature component of the demodulated signal output from the demodulator 34 to eliminate aliases in the quadrature component. The first anti-aliasing filter 36 and the second anti-aliasing filter 28 may be configured with low-pass filters.

The first AD converter 40 samples the in-phase component of the demodulated signal filtered by the first anti-aliasing filter 36 to output a first digital signal corresponding to the in-phase component. The second AD converter 42 samples the quadrature component of the demodulated signal filtered by the second anti-aliasing filter 38 to output a second digital signal corresponding to the quadrature component.

The judging section 18 judges acceptability of the plurality of modulated signal output by the device under test 100, based on the digital signals output from the AD converting section 16. The judging section 18 of the present embodiment judges acceptability of the plurality of modulated signals output by the device under test 100, based on the first digital signal and the second digital signal. The judging section 18 outputs the result of the acceptability judgment to the outside.

The judging section 18 of the present embodiment includes a demodulated signal storage section 52, an expected value storage section 54, and a calculating section 56. The demodulated signal storage section 52 stores therein the first digital signal and the second digital signal output from the AD converting section 16. The expected value storage section 54 stores therein expected value signals indicating the expected values of the demodulated signals being acquired. The calculating section 56 judges the acceptability of the plurality of modulated signals output from the device under test 100 by comparing (i) signal points on the Cartesian plane determined by the first digital signal and the second digital signal stored in the demodulated signal storage section 52 and (ii) signal points on the Cartesian plane determined by the expected value signals stored in the expected value storage section 54.

Since the test apparatus 10 judges acceptability of the plurality of synthesized modulated signals, the circuit size necessary for performing demodulation and an analog-to-digital conversion process is decreased, which lowers the overall cost. Furthermore, the test apparatus 10 can accurately judge acceptability because it is not necessary that the characteristics match between circuits used to perform the demodulation and the AD conversion process.

Figure 2:
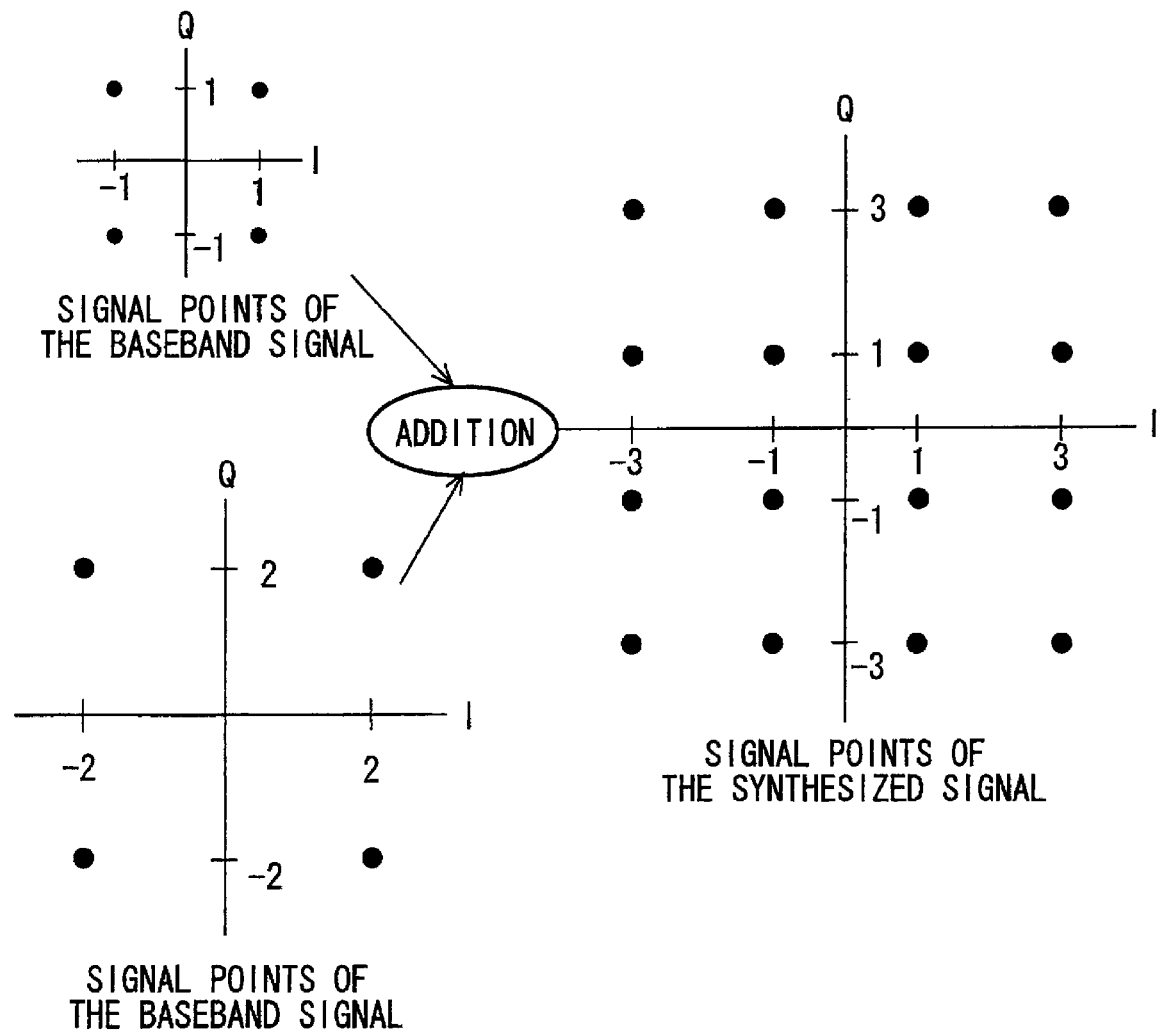
FIG. 2 shows exemplary signal points of the synthesized signals and baseband signals obtained when the device under test 100 is operating in a mode that sends each baseband signal with a different gain.
Figure 3:
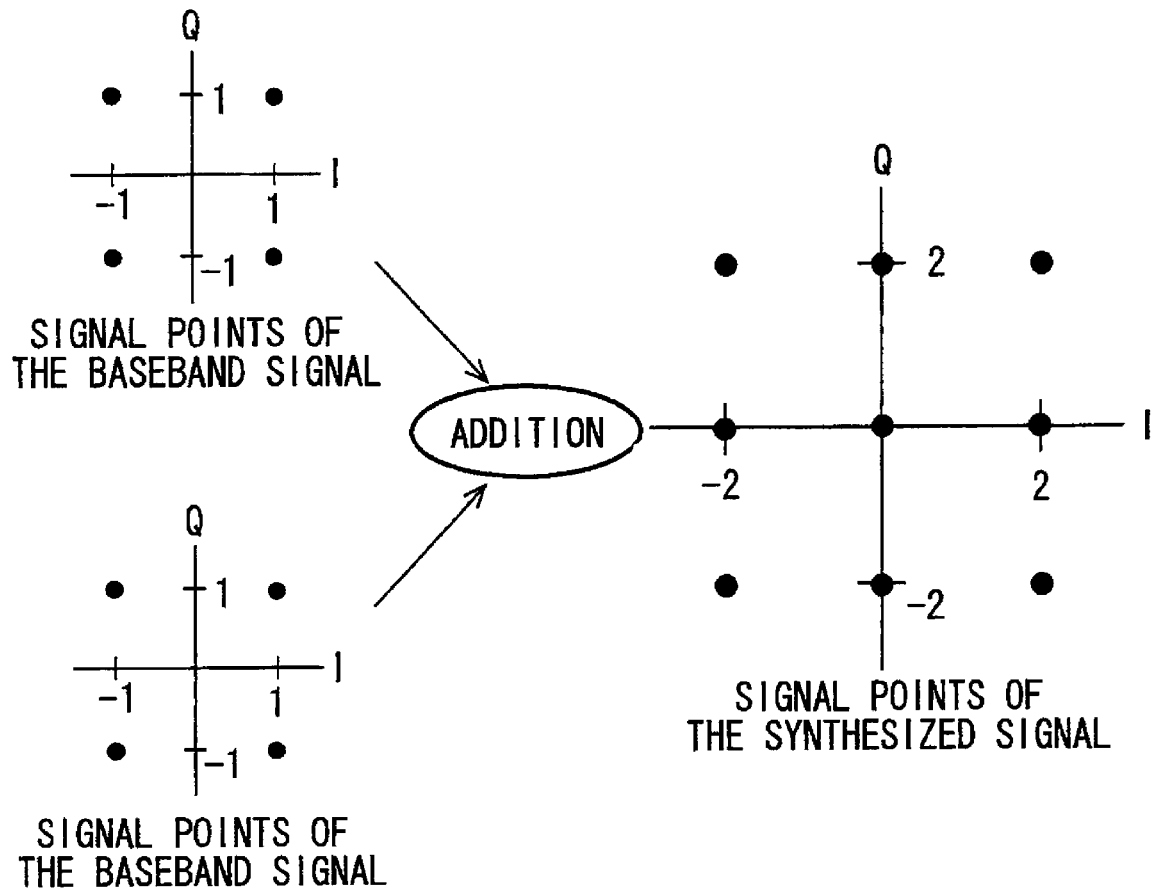
FIG. 3 shows exemplary signal points of the synthesized signals and baseband signals obtained when the device under test 100 is operating in a mode that sends each baseband signal with the same gain.

FIG. 2 shows exemplary signal points of the synthesized signals and baseband signals obtained when the device under test 100 is operating in a mode that sends each baseband signal with a different gain. FIG. 3 shows exemplary signal points of the synthesized signals and baseband signals obtained when the device under test 100 is operating in a mode that sends each baseband signal with the same gain.

In the present embodiment, the device under test 100 generates the plurality of modulated signals by quadrature demodulating the plurality of baseband signals having synchronous phases, with the carrier signals having identical frequencies. The in-phase component obtained by quadrature demodulating the synthesized signal resulting from the combination of the plurality of modulated signals matches a signal obtained by combining the in-phase component of each baseband signal. In a similar way, the quadrature component obtained by quadrature demodulating the synthesized signal resulting from the combination of the plurality of modulated signals matches a signal obtained by combining the quadrature component of each baseband signal. Accordingly, the judging section 18 may set the expected value signals to be equal to (i) the signal obtained by combining the in-phase component of each baseband signal generated by the device under test 100 and (ii) the signal obtained by combining the quadrature component of each baseband signal generated by the device under test 100.

The judging section 18 storing these expected value signals may determine the acceptability of the plurality of modulated signals by comparing the signal points of the demodulated signals on the Cartesian plane and the signal points of the expected value signals on the Cartesian plane. More specifically, the judging section 18 may judge the acceptability of the plurality of modulated signals based on whether the phase and amplitude of each demodulated signal is within the range of the expected values of the phase and amplitude designated in accordance with the combination of the plurality of baseband signals. For example, the judging section 18 judges the acceptability based on whether the ideal signal points nearest the signal points indicated by the first digital signal and the second digital signal are the same as signal points indicated by the expected values. As another example, the judging section 18 calculates the distance between (i) the signal points indicated by the first digital signal and the second digital signal and (ii) the signal points indicated by the expected values. The judging section 18 determines the signal to be acceptable if the calculated distance is less than or equal to a predetermined value, and determines the signal to be unacceptable if the calculated distance is greater than a predetermined value.

In the present embodiment, the device under test 100 can switch between operating in a first mode and a second mode. The first mode involves generating the plurality of modulated signals by quadrature modulating the plurality of baseband signals with substantially the same gain. The second mode involves generating the plurality of modulated signals by quadrature modulating the plurality of baseband signals with different gains.

The number of signal points of the synthesized signal when the device under test 100 is operating in the second mode is equal to the number of combinations of the modulated signals output from the device under test 100 and signal points included in the baseband signals. For example, when the baseband signals are modulated with QPSK, as shown in FIG. 2, there are 16 signal points of the synthesized signal when the device under test 100 is operating in the second mode.

The number of signal points of the synthesized signal when the device under test 100 is operating in the first mode is less than the number of combinations of modulated signals output by the device under test 100 and signal points included in the baseband signals, since combinations having common signal points exist. Accordingly, the number of signal points of the synthesized signal when the device under test 100 is operating in the first mode is less than the number of signal points of the synthesized signal when the device under test 100 is operating in the second mode. For example, when the baseband signals are modulated with QPSK, as shown in FIG. 3, there are 9 signal points of the synthesized signal when the device under test 100 is operating in the first mode.

In this way, the amount of calculations for judging acceptability when the device under test 100 is operating in the first mode is less than the amount of calculations for judging acceptability when the device under test 100 is operating in the second mode. Therefore, the test apparatus 10 can increase the speed of the acceptability judgment process by causing the device under test 100 to operate in the first mode.

When operating in the second mode, some MIMO devices under test 100 include information indicating the gain of each baseband signal at a prescribed position, known as a "preamble," in the modulated signal. When the device under test 100 is tested while operating in the second mode, the synthesizing section 14 may acquire a setting value of the gain from the prescribed position in each modulated signal. The synthesizing section 14 may adjust the level of each modulated signal received from the device under test 100 according to the acquired setting value to set the gain of the baseband signals corresponding to the modulated signals to be substantially equal. In this way, even when the device under test 100 is operating in the second mode, the test apparatus 10 can decrease the number of signal points of the synthesized signal just as in the first mode, thereby decreasing the amount of processing needed for the acceptability judgment.

Figure 4:
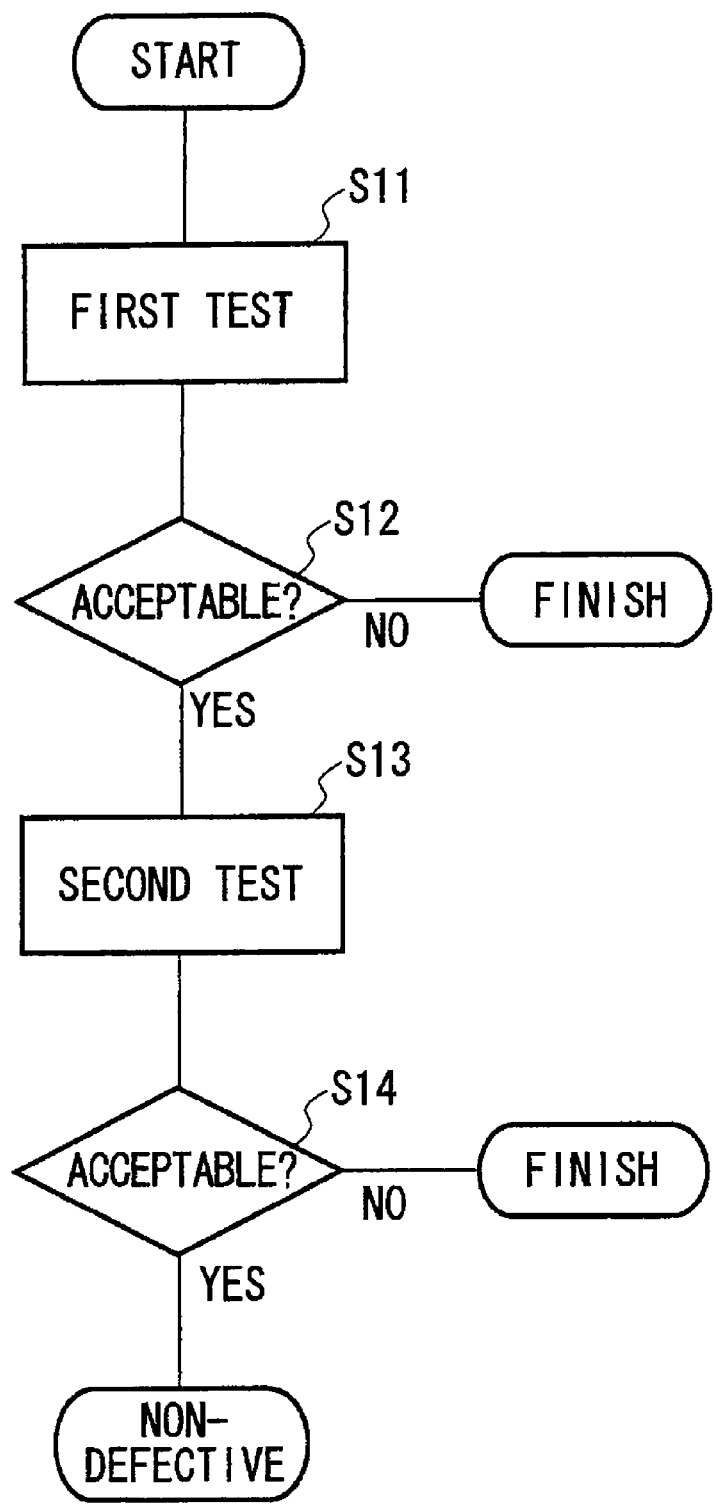
FIG. 4 shows an exemplary testing procedure performed by the test apparatus 10.

FIG. 4 shows an exemplary testing procedure performed by the test apparatus 10. First, the test control section 20 causes the test signal generating section 12 to generate a test signal causing the device under test 100 to operate in the first mode. While the device under test 100 is operating in the first mode, the test control section 20 performs a first test that causes the judging section 18 to judge the acceptability of the plurality of modulated signals (S11).

The test control section 20 determines whether the plurality of modulated signals are judged to be acceptable during the first test (S12). If the plurality of signals are judged to be unacceptable during the first test, (the "No" of S12), the device under test 100 is judged to be defective and the process is finished.

If the plurality of signals are judged to be unacceptable during the first test (the "Yes" of S12), the test control section 20 causes the test signal generating section 12 to generate a test signal causing the device under test 100 to operate in the second mode. While the device under test 100 is operating in the second mode, the test control section 20 performs a second test that causes the judging section 18 to judge the acceptability of the plurality of modulated signals (S13).

The test control section 20 determines whether the plurality of modulated signals are judged to be acceptable during the second test (S14). If the plurality of signals are judged to be unacceptable during the second test (the "No" of S14), the device under test 100 is judged to be defective and the process is finished.

If the test control section 20 determines that the plurality of modulated signals are acceptable during the first test and the second test, the device under test 100 is judged to be non-defective (the "Yes" of S14).

Figure 5:
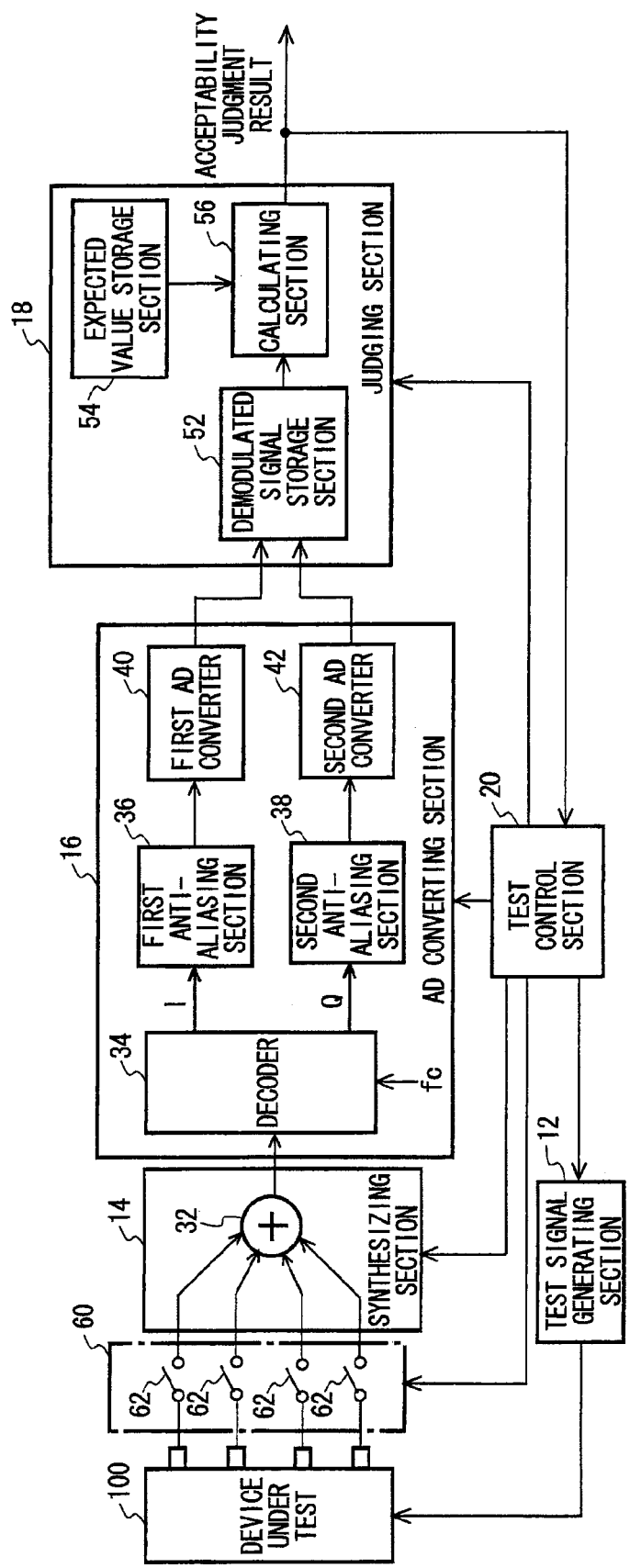
FIG. 5 shows a configuration of the test apparatus 10 according to a first modification, along with a device under test 100.

FIG. 5 shows a configuration of the test apparatus 10 according to a first modification of the present embodiment, along with a device under test 100. The test apparatus 10 of the present modification adopts substantially the same function and configuration as the test apparatus 10 shown in FIG. 1, and therefore components in FIG. 5 that are substantially the same as components in FIG. 1 are given the same reference numerals, and the following description includes only differing points.

The test apparatus 10 of the present modification is further provided with a switch section 60. The switch section 60 includes a plurality of switches 62 that correspond one-to-one with the plurality of modulated signals output from the device under test 100. Each switch 62 controls whether the corresponding modulated signal is supplied to the synthesizing section 14.

When the switch section 60 is provided, the test control section 20 performs the first test causing the judging section 18 to judge the acceptability of the plurality of modulated signals while the plurality of switches 62 are turned on. If the plurality of signals are judged to be unacceptable during the first test, the test control section 20 performs the second test causing the judging section 18 to judge the acceptability of at least one of the modulated signals, selected from among the plurality of modulated signals, while at least one switch 62 corresponding to the at least one modulated signal is turned on and the other switches 62 are turned off.

By testing according to the above procedure, the test apparatus 10 can individually test each modulated signal only for a device under test 100 that is judged to be defective based on the acceptability judgment according to the synthesized signal. In this way, the test apparatus 10 can efficiently test a plurality of devices under test 100.

Figure 6:
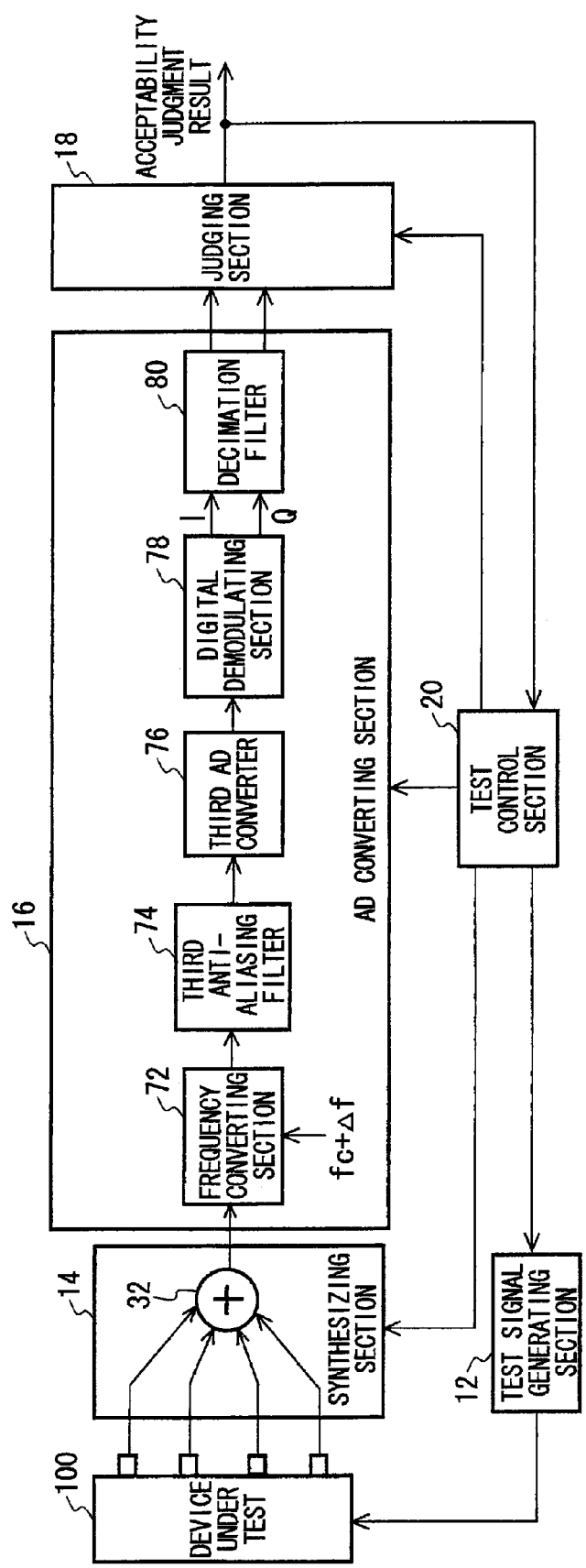
FIG. 6 shows a configuration of the test apparatus 10 according to a second modification, along with the device under test 100.

FIG. 6 shows a configuration of the test apparatus 10 according to a second modification, along with the device under test 100. The test apparatus 10 of the present modification adopts substantially the same function and configuration as the test apparatus 10 shown in FIG. 1, and therefore components in FIG. 6 that are substantially the same as components in FIG. 1 are given the same reference numerals, and the following description includes only differing points.

The AD converting section 16 of the present modification includes a frequency converting section 72, a third anti-aliasing filter 74, a third AD converter 76, a digital demodulating section 78, and a decimation filter 80. The frequency converting section 72 multiplies the synthesized signal output by the synthesizing section 14 by a local signal having a prescribed frequency, to output an intermediate signal having a frequency lower than that of the synthesized signal. For example, the frequency converting section 72 may multiply the synthesized signal by a local signal having a frequency obtained by adding a carrier frequency fc to an intermediate frequency $\Delta f$. In this case, the frequency converting section 72 sets the intermediate frequency $\Delta f$ to be higher than a frequency equal to half of the bandwidth of the modulated signal. For example, if the carrier frequency of the modulated signal is 5.2 GHz and the bandwidth of the modulated signal is 40 MHz, the frequency converting section 72 multiplies the synthesized signal by a local signal having a frequency obtained by adding the carrier frequency fc to the intermediate frequency $\Delta f$, which is at least higher than 20 MHz.

The third anti-aliasing filter 74 filters the intermediate signal output from the frequency converting section 72 to eliminate the aliases in the intermediate signal. The third AD converter 76 samples the intermediate signal sampled by the third anti-aliasing filter 74 to output a digital signal corresponding to the intermediate signal. The digital demodulating section 78 quadrature demodulates the digital signal output from the third AD converter 76 to output the demodulated signals. More specifically, the digital demodulating section 78 quadrature demodulates the digital signal output from the third AD converter 76 with the intermediate frequency $\Delta f$ to output the first digital signal indicating the in-phase component of the demodulated signal and the second digital signal indicating the quadrature component of the demodulated signal.

The decimation filter 80 decreases the sampling frequency of the first digital signal and the second digital signal by thinning the data values of the first digital signal and the second digital signal output from the digital demodulating section 78. The judging section 18 judges the acceptability of the plurality of modulated signals output from the device under test 100 based on the first digital signal indicating the in-phase component of the demodulated signal and the second digital signal indicating the quadrature component of the demodulated signal.

Since the test apparatus 10 of the present modification filters and AD converts the intermediate signal, the test apparatus 10 should be provided with at least one each of the third anti-aliasing filter 74 and the third AD converter 76. In this way, the test apparatus 10 enables the circuits performing the demodulation and AD conversion to be smaller. Furthermore, by making the acceptability judgment after thinning the data values with the decimation filter 80, the test apparatus 10 of the present modification can decrease the amount of processing needed for the acceptability judgment.

Figure 7:
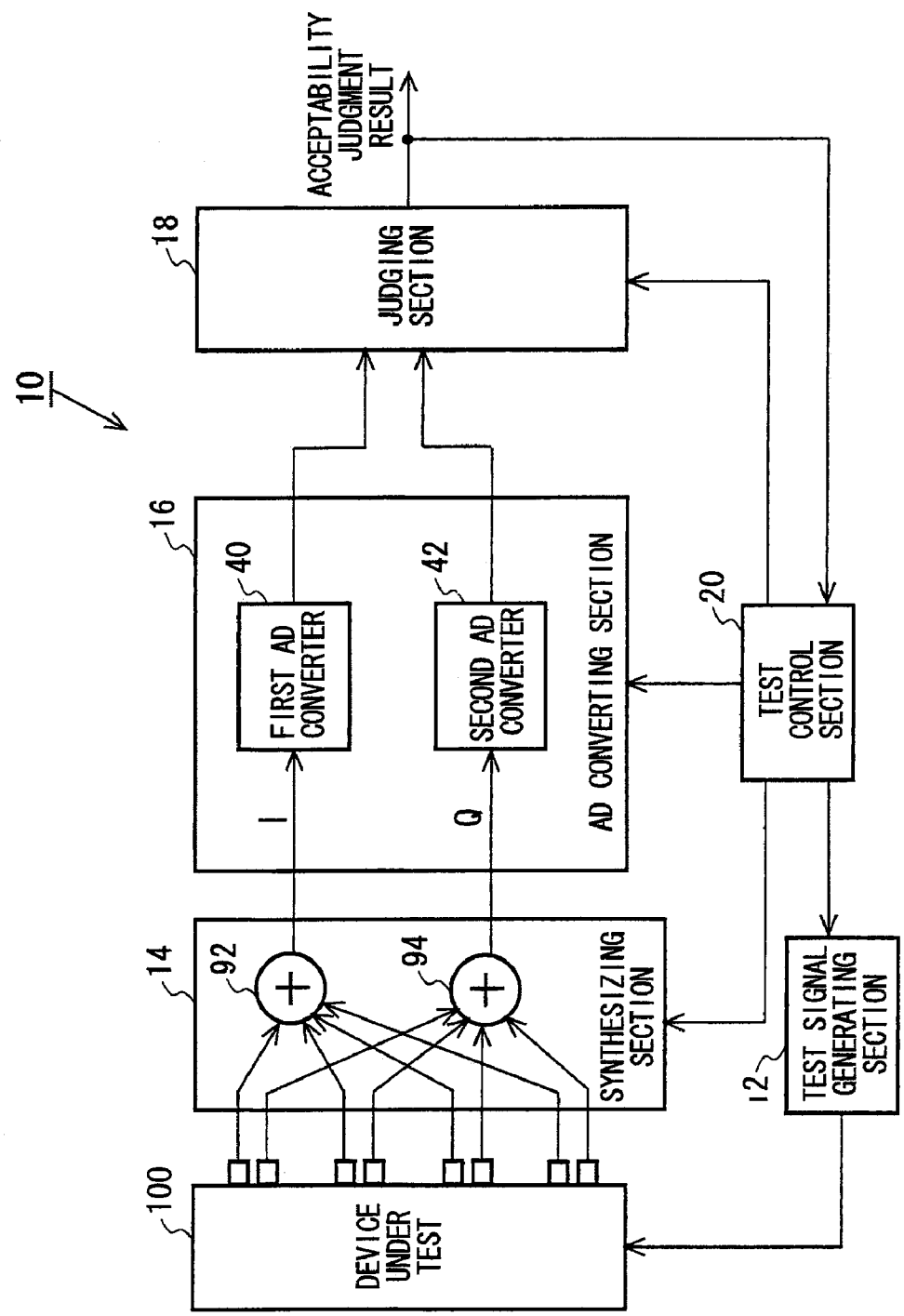
FIG. 7 shows a configuration of the test apparatus 10 according to a third modification, along with the device under test 100.

FIG. 7 shows a configuration of the test apparatus 10 according to a third modification, along with the device under test 100. In the third modification, the device under test 100 outputs a plurality of baseband signals including in-phase components (I) and quadrature components (Q), instead of the plurality of modulated signals. The test apparatus 10 of the present modification receives a plurality of baseband signals, instead of the plurality of modulated signals, to test the device under test 100. The test apparatus 10 of the present modification adopts substantially the same function and configuration as the test apparatus 10 shown in FIG. 1, and therefore components in FIG. 7 that are substantially the same as components in FIG. 1 are given the same reference numerals, and the following description includes only differing points.

The test signal generating section 12 supplies the device under test 100 with a test signal causing the device under test 100 to simultaneously output the plurality of baseband signals. The synthesizing section 14 receives the plurality of baseband signals output by the device under test 100 in response to the test signal. The synthesizing section 14 combines the in-phase components of the plurality of input baseband signals into a single signal, and also combines the quadrature components of the plurality of input baseband signals into a single signal, to output a synthesized signal. The synthesizing section 14 of the present modification may include a first adder 92 that adds together the in-phase components of the plurality of baseband signals to output the in-phase component of the synthesized signal and a second adder 94 that adds together the quadrature components of the plurality of baseband signals to output the quadrature component of the synthesized signal.

The AD converting section 16 samples the in-phase component and the quadrature component of the synthesized signal to output a digital signal corresponding to the synthesized signal. For example, the AD converting section 16 of the present modification may include the first AD converter 40 and the second AD converter 42. The first AD converter 40 samples the in-phase component of the input synthesized signal to output the first digital signal corresponding to the in-phase component. The second AD converter 42 samples the quadrature component of the input synthesized signal to output the second digital signal corresponding to the quadrature component.

Since the test apparatus 10 of the third modification judges acceptability of the plurality of synthesized baseband signals, the size of the circuit needed for the AD conversion process is decreased, and the overall cost of the circuit is lowered. Furthermore, the test apparatus 10 can accurately judge acceptability because it is not necessary that the characteristics match between circuits used to perform the AD conversion process.

Figure 8:
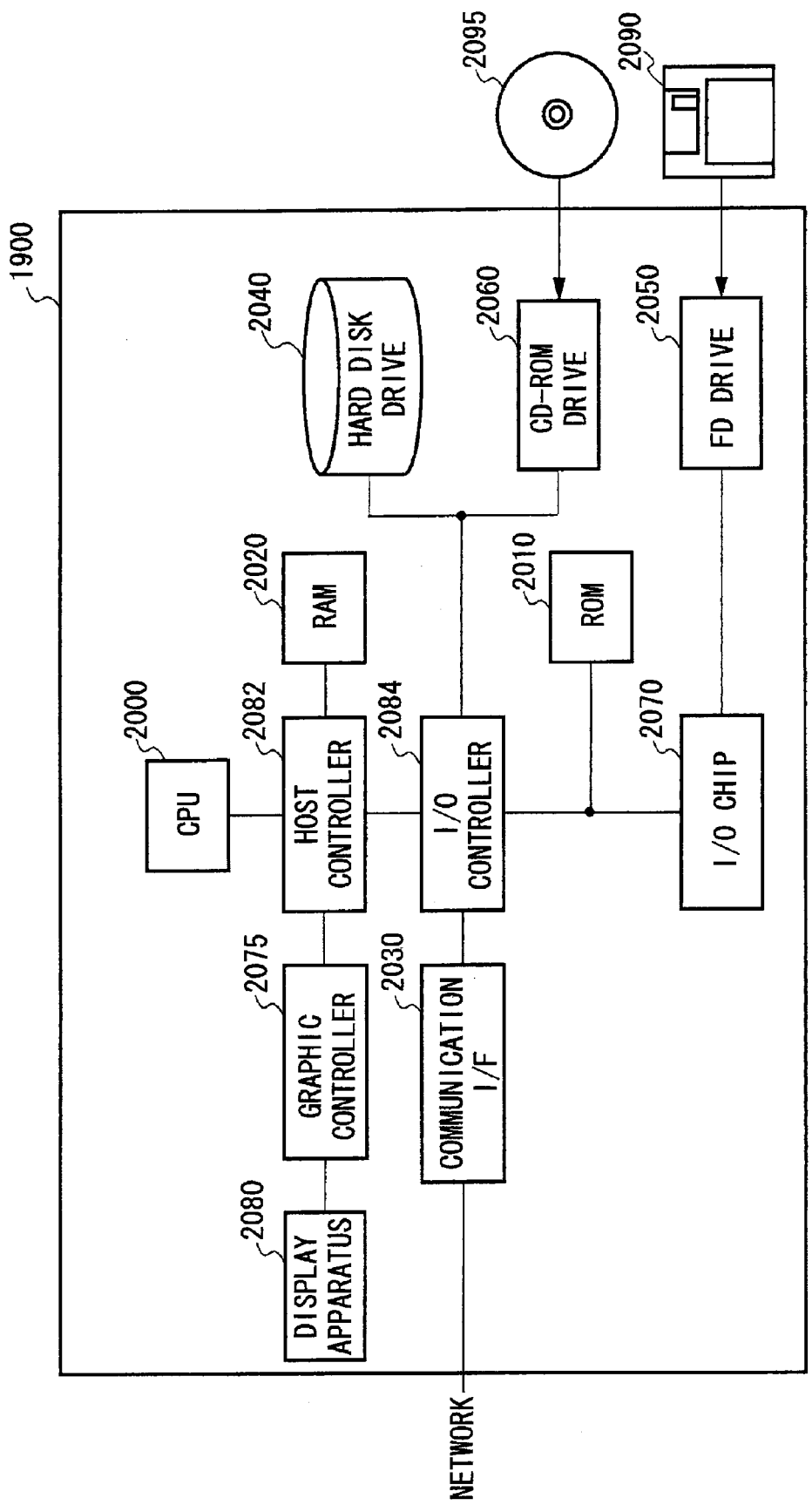
FIG. 8 shows an example of a hardware configuration of a computer 1900 according to an embodiment of the present invention.

FIG. 8 shows an example of a hardware configuration of a computer 1900 according to the present embodiment. The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as the test apparatus 10 are provided with a test signal generating section module, a synthesizing section module, an AD converting section module, a judging section module, and a test control section module. Furthermore, the above programs may be provided with a display module instead of the output module. These programs and modules prompt the CPU 2000 or the like to make the computer 1900 function as the test signal generating section 12, the synthesizing section 14, the AD converting section 16, the judging section 18, and the test control section 20, respectively.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test apparatus that tests a device under test that outputs a plurality of modulated signals modulated with carrier signals having frequencies identical to each other, comprising:

a synthesizing section that synthesizes the plurality of modulated signals to output a synthesized signal;

an AD converting section that samples the synthesized signal to output a digital signal corresponding to the synthesized signal; and a judging section that judges acceptability of the plurality of modulated signals output by the device under test, based on the digital signal.

2. The test apparatus according to claim 1, wherein the AD converting section includes:

a demodulator that quadrature demodulates the synthesized signal output by the synthesizing section to output a demodulated signal;

a first AD converter that samples an in-phase component of the demodulated signal to output a first digital signal corresponding to the in-phase component; and a second AD converter that samples a quadrature component of the demodulated signal to output a second digital signal corresponding to the quadrature component, and the judging section judges the acceptability of the plurality of modulated signals output by the device under test based on the first digital signal and the second digital signal.

3. The test apparatus according to claim 1, wherein the AD converting section includes:

a frequency converting section that multiplies the synthesized signal output from the synthesizing section by a local signal having a prescribed frequency to output an intermediate signal having a frequency lower than that of the synthesized signal;

an AD converter that samples the intermediate signal to output a digital signal corresponding to the intermediate signal; and a demodulator that quadrature demodulates the digital signal to output a demodulated signal, and the judging section judges the acceptability of the plurality of modulated signals output by the device under test based on a first digital signal indicating the in-phase component of the demodulated signal and a second digital signal indicating the quadrature component of the demodulated signal.

4. The test apparatus according to claim 3, wherein, the AD converting section further includes a decimation filter that decreases a sampling frequency of the first digital signal and the second digital signal by thinning the data values in the first digital signal and the second digital signal output by the demodulator.

5. The test apparatus according to claim 3, wherein the device under test quadrature modulates each of a plurality of baseband signals to generate the plurality of modulated signals, and the judging section judges the acceptability of the plurality of modulated signals based on whether a phase and an amplitude of each demodulated signal is within a range of expected values of the phase and amplitude designated according to a combination of the plurality of baseband signals.

6. The test apparatus according to claim 1, wherein the device under test can switch between operating in a first mode and a second mode, the first mode involves generating the plurality of modulated signals by quadrature modulating each of the plurality of baseband signals with substantially the same gain, the second mode involves generating the plurality of modulated signals by quadrature modulating each of the plurality of baseband signals with a different gain, the test apparatus further includes a test control section that performs a first test causing the judging section to judge the acceptability of the plurality of modulated signals while the device under test operates in the first mode, and performs a second test causing the judging section to judge the acceptability of the plurality of modulated signals while the device under test operates in the first mode, the second test being performed on a condition that the plurality of modulated signals are judged to be acceptable during the first test, and the test control section judges the device under test to be non-defective if the plurality of modulated signals are judged to be acceptable in both the first test and the second test.

7. The test apparatus according to claim 1, further comprising:

a plurality of switches that are provided to correspond one-to-one with the plurality of modulated signals, and that each switch whether the corresponding modulated signal is supplied to the synthesizing section; and a test control section that performs a first test in which the judging section judges the acceptability of the plurality of modulated signals while the plurality of switches are turned on, and performs a second test in which the judging section judges the acceptability of at least one of the plurality of modulated signals while at least one switch corresponding to the at least one modulated signal is turned on and the other switches are turned off, the second test being performed on a condition that the plurality of modulated signals are judged to be acceptable during the first test.

8. The test apparatus according to claim 2, wherein the device under test quadrature modulates each of a plurality of baseband signals to generate the plurality of modulated signals, and the judging section judges the acceptability of the plurality of modulated signals based on whether a phase and an amplitude of each demodulated signal is within a range of expected values of the phase and amplitude designated according to a combination of the plurality of baseband signals.

9. The test apparatus according to claim 8, wherein the device under test can switch between operating in a first mode and a second mode, the first mode involves generating the plurality of modulated signals by quadrature modulating each of the plurality of baseband signals with substantially the same gain, the second mode involves generating the plurality of modulated signals by quadrature modulating each of the plurality of baseband signals with a different gain, the test apparatus further includes a test control section that performs a first test causing the judging section to judge the acceptability of the plurality of modulated signals while the device under test operates in the first mode, and performs a second test causing the judging section to judge the acceptability of the plurality of modulated signals while the device under test operates in the first mode, the second test being performed on a condition that the plurality of modulated signals are judged to be acceptable during the first test, and the test control section judges the device under test to be non-defective if the plurality of modulated signals are judged to be acceptable in both the first test and the second test.

10. The test apparatus according to claim 8, further comprising:
   a plurality of switches that are provided to correspond one-to-one with the plurality of modulated signals, and that each switch whether the corresponding modulated signal is supplied to the synthesizing section; and
   a test control section that performs a first test in which the judging section judges the acceptability of the plurality of modulated signals while the plurality of switches are turned on, and performs a second test in which the judging section judges the acceptability of at least one of the plurality of modulated signals while at least one switch corresponding to the at least one modulated signal is turned on and the other switches are turned off, the second test being performed on a condition that the plurality of modulated signals are judged to be acceptable during the first test.

11. A test method for testing a device under test that outputs a plurality of modulated signals modulated with carrier signals having frequencies identical to each other, comprising the steps of:
   synthesizing the plurality of modulated signals to output a synthesized signal;
   sampling the synthesized signal to output a digital signal corresponding to the synthesized signal; and
   judging acceptability of the plurality of modulated signals output by the device under test, based on the digital signal.

12. A test apparatus that tests a device under test that outputs a plurality of baseband signals, comprising:
   a synthesizing section that synthesizes the plurality of baseband signals to output a synthesized signal;
   an AD converting section that samples the synthesized signal to output a digital signal corresponding to the synthesized signal; and
   a judging section that judges acceptability of the plurality of baseband signals output by the device under test, based on the digital signal.

13. A test method for testing a device under test that outputs a plurality of baseband signals, comprising the steps of:
   synthesizing the plurality of baseband signals to output a synthesized signal;
   performing an AD conversion by sampling the synthesized signal to output a digital signal corresponding to the synthesized signal; and
   judging acceptability of the plurality of baseband signals output by the device under test, based on the digital signal.

* * * * *